(12) United States Patent
Song et al.

(10) Patent No.: US 9,299,711 B2
(45) Date of Patent: Mar. 29, 2016

(54) FIELD EFFECT TRANSISTORS INCLUDING ASYMMETRICAL SILICIDE STRUCTURES AND RELATED DEVICES

(71) Applicants: Tae Joong Song, Seongnam-si (KR); Gyu Hong Kim, Seoul (KR); Jae Ho Park, Suwon-si (KR); Jong Hoon Jung, Seoul (KR)

(72) Inventors: Tae Joong Song, Seongnam-si (KR); Gyu Hong Kim, Seoul (KR); Jae Ho Park, Suwon-si (KR); Jong Hoon Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 166 days.

(21) Appl. No.: 14/032,769

(22) Filed: Sep. 20, 2013

(65) Prior Publication Data

US 2014/0085966 A1  Mar. 27, 2014

(30) Foreign Application Priority Data

Sep. 26, 2012 (KR) .......................... 10-2012-0107381

(51) Int. Cl.
*H01L 29/78* (2006.01)
*H01L 27/11* (2006.01)
*H01L 29/417* (2006.01)
*G11C 11/419* (2006.01)
*G11C 11/412* (2006.01)

(52) U.S. Cl.
CPC .......... *H01L 27/1104* (2013.01); *G11C 11/419* (2013.01); *H01L 29/41791* (2013.01); *H01L 29/785* (2013.01); *G11C 11/412* (2013.01)

(58) Field of Classification Search
CPC .............. H01L 27/1104; H01L 29/785; H01L 2029/7858; H01L 29/41791
See application file for complete search history.

(56) References Cited

U.S. PATENT DOCUMENTS

| 6,756,638 | B2 | 6/2004 | Chang et al. | |
|---|---|---|---|---|
| 7,348,642 | B2 | 3/2008 | Nowak | |
| 7,402,862 | B2 | 7/2008 | Choi et al. | |
| 7,906,802 | B2 | 3/2011 | Baumgartner et al. | |
| 7,982,269 | B2 | 7/2011 | Anderson et al. | |
| 8,053,314 | B2 | 11/2011 | Anderson et al. | |
| 8,072,798 | B2 * | 12/2011 | Takeyama | 365/154 |
| 8,138,030 | B2 | 3/2012 | Chang et al. | |
| 8,399,931 | B2 * | 3/2013 | Liaw et al. | 257/369 |
| 8,952,547 | B2 * | 2/2015 | Liaw | 257/775 |
| 2007/0029624 | A1 | 2/2007 | Nowak | |
| 2007/0181946 | A1 | 8/2007 | Mathew et al. | |
| 2008/0308880 | A1 * | 12/2008 | Inaba | 257/401 |

(Continued)

FOREIGN PATENT DOCUMENTS

| JP | 2000-138369 | 5/2000 |
|---|---|---|
| JP | 2006-294995 | 10/2006 |
| JP | 2006-0294995 A | 10/2006 |
| JP | 2007-158139 | 6/2007 |
| JP | 2008-028263 | 2/2008 |
| WO | WO 2008/033982 A2 | 3/2008 |
| WO | WO 2009/012276 A2 | 1/2009 |

OTHER PUBLICATIONS

European Search Report Corresponding to European Patent Application No. 13 18 5519; Dated: Aug. 25, 2014; 10 Pages.

*Primary Examiner* — Allison P Bernstein
(74) *Attorney, Agent, or Firm* — Myers Bigel & Sibley, P.A

(57) ABSTRACT

A fin Field Effect Transistor (finFET) can include a source region and a drain region of the finFET. A gate of the finFET can cross over a fin of the finFET between the source and drain regions. First and second silicide layers can be on the source and drain regions respectively. The first and second silicide layers can include respective first and second surfaces that face the gate crossing over the fin, where the first and second surfaces are different sizes.

23 Claims, 25 Drawing Sheets

(56) References Cited

U.S. PATENT DOCUMENTS

| | | | |
|---|---|---|---|
| 2009/0101975 A1* | 4/2009 | Holz et al. | .................... 257/347 |
| 2010/0155842 A1 | 6/2010 | Anderson et al. | |
| 2011/0065244 A1 | 3/2011 | Chang et al. | |
| 2012/0001197 A1 | 1/2012 | Liaw et al. | |
| 2012/0086054 A1* | 4/2012 | Cheng et al. | .................. 257/288 |
| 2013/0049115 A1 | 2/2013 | Cheng et al. | |
| 2013/0082331 A1* | 4/2013 | Fukuda | .......................... 257/368 |
| 2014/0252477 A1* | 9/2014 | Tseng et al. | ................... 257/347 |

\* cited by examiner

FIELD EFFECT TRANSISTORS INCLUDING ASYMMETRICAL SILICIDE STRUCTURES AND RELATED DEVICES

CROSS-REFERENCE TO RELATED APPLICATIONS

This application claims priority under 35 U.S.C. §119(a) from Korean Patent Application No. 10-2012-0107381 filed on Sep. 26, 2012, the disclosure of which is hereby incorporated by reference in its entirety.

BACKGROUND

Embodiments of the inventive concept relate to memory devices, and more particularly, to fin field effect transistors (FETs).

As FETs becomes smaller and the manufacturing processes thereof more segmented, the complexity of related transistor contacts may become an issue. As such contacts become more complicated, parasitic capacitance associated with those contacts may be a problem.

SUMMARY

Embodiments according to the inventive concept may provide FETs including asymmetrical silicide structures and related devices. Pursuant to these embodiments, in some embodiments of the inventive concept, a field effect transistor can include a first silicide layer on a source of the FET where the first silicide layer can be separated from a gate of the FET. A second silicide layer can be on a drain of the FET and the second silicide layer can be separated from the gate and at least one contact layer can be on each of the first and second silicide layers. An aspect ratio of at least one of the first and second silicide layers can be adjusted so that the first and second silicide layers are asymmetric to one another.

In some embodiments according to the inventive concept, a memory device can include a memory cell array that includes a plurality of memory cells. A peripheral circuit can be configured to access the memory cells, where each of the memory cells can include a plurality of field effect transistors. The field effect transistors can include a first silicide layer on a source of the FET, where the first silicide layer can be separated from a gate of the FET. A second silicide layer can be on a drain of the FET, where the second silicide layer can be separated from the gate and have an area with respect to the gate, which has an asymmetric relation with an area of the first silicide layer with respect to the gate. At least one contact can be positioned on each of the first and second silicide layers. In some embodiments according to the inventive concept, a memory controller can include a memory device and a microprocessor that can be configured to control operation of the memory device. The memory device can include a memory cell array with a plurality of memory cells each of which each can include a plurality of field effect transistors, an access control circuit that can be configured to access the memory cell array to perform a read operation or a write operation, and a control signal generation circuit that can be configured to generate a control signal for controlling an operation of the access control circuit.

In some embodiments according to the inventive concept, an system-on-chip (SoC) can include a central processing unit (CPU), a memory controller that can be configured to access an external memory to read or write data according to the control of the CPU, and a memory device that can be configured to store the data to be read or written according to the control of the CPU. The memory device can include a memory cell array including a plurality of memory cells and a peripheral circuit that can be configured to access the memory cells.

Each of the memory cells can include a plurality of field effect transistors. Each of the field effect transistors can include a first silicide layer positioned on a source and separated from a gate. A second silicide layer can be positioned on a drain and separated from the gate, the second silicide layer can have an area with respect to the gate which has an asymmetric relation with an area of the first silicide layer with respect to the gate. At least one contact can be positioned on each of the first and second silicide layers.

In some embodiments, a fin Field Effect Transistor (finFET) can include a source region and a drain region of the finFET. A gate of the finFET can cross over a fin of the finFET between the source and drain regions. First and second silicide layers can be on the source and drain regions respectively. The first and second silicide layers can include respective first and second surfaces that face the gate crossing over the fin, where the first and second surfaces are different sizes.

BRIEF DESCRIPTION OF THE DRAWINGS

The above and other features and advantages of the inventive concept will become more apparent by describing in detail exemplary embodiments thereof with reference to the attached drawings in which.

DETAILED DESCRIPTION OF THE EMBODIMENTS

Figure 1:
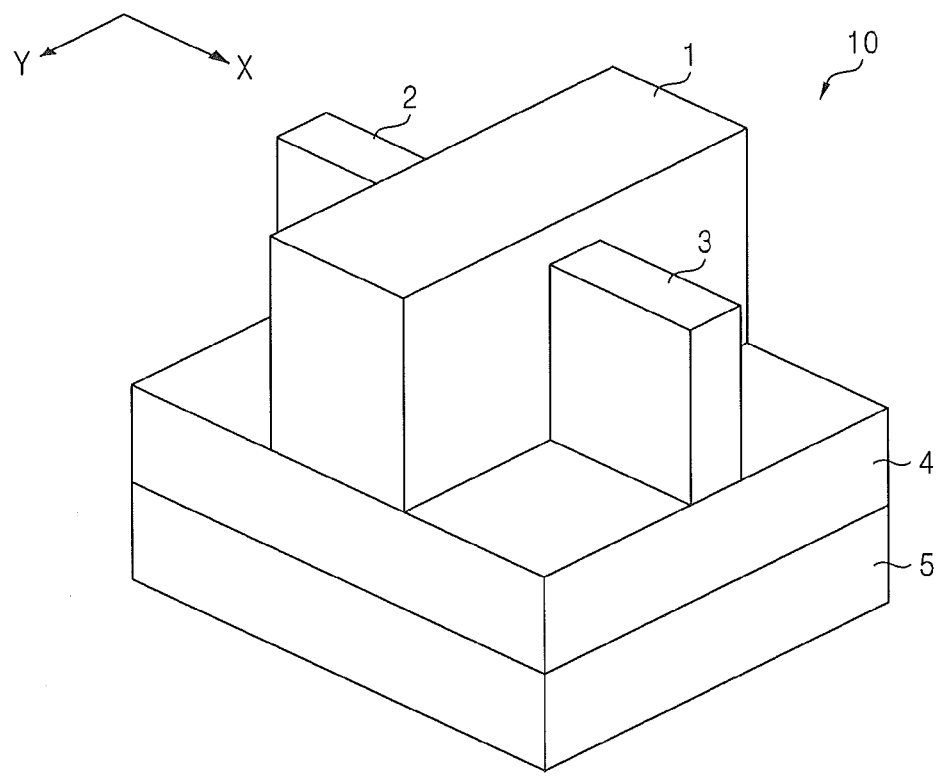
FIG. 1 is a perspective view of a field effect transistor (FET)

Example embodiments of the inventive concept are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments. vSpatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

FIG. 1 is a perspective view of a field effect transistor (FET) 10. The FET 10 includes a substrate 5, an insulating layer 4, a source 2, a drain 3, and a gate 1. The insulating layer 4 is formed on the substrate 5 (e.g., a Si substrate) and the FET 10 is formed on the insulating layer 4 (e.g., a $SiO_2$ layer). The FET 10 usually includes a fin (between the source 2 and the drain 3) formed of silicon or other semiconductor material and the gate 1 formed of polysilicon or other semiconductor material to cover the fin. A channel is formed at a part of the fin extending below the gate 1 between the source and region drain, The FET 10 has a double-gate structure surrounding the channel.

Figure 2:
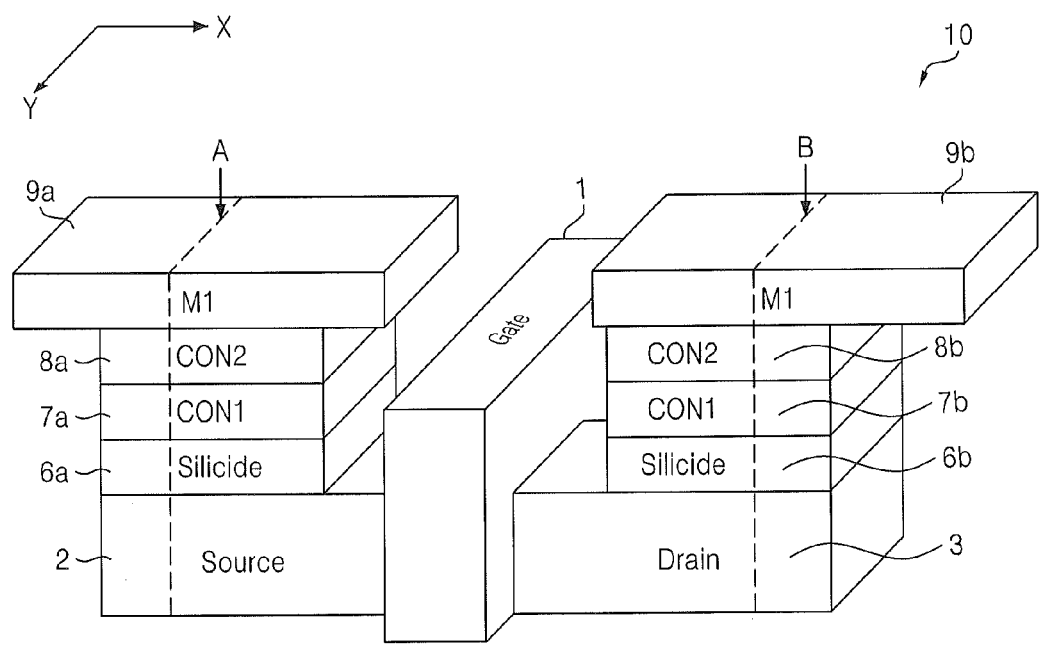
FIG. 2 is a detailed perspective view of a FET according to some embodiments of the inventive concept.

FIG. 2 is a detailed perspective view of the FET 10 according to some embodiments of the inventive concept. Referring to FIG. 2, the FET 10 includes the gate 1, the source 2, the drain 3, silicide layers 6a and 6b, one or more contact layers 7a, 7b, 8a, and 8b, and one or more metal lines 9a and 9b.

The FET 10 may be implemented in a fin structure formed by etching a semiconductor substrate to form silicon fins, filling a space (or a trench) between adjacent silicon fins with insulating material to electrically isolate the adjacent silicon fins from each other, and exposing a side wall of the silicon fins. In other words, the gate 1 is between the source 2 and the drain 3 and the silicide layers 6a and 6b, the contact layers 7a, 7b, 8a, and 8b, and the metal lines 9a and 9b are separated from the gate 1.

The contact layers 7a, 7b, 8a, and 8b are stacked to connect the source 2 and the drain 3 to the metal lines 9a and 9b, respectively. In other words, the contact layers 7a, 7b, 8a, and 8b electrically connect the source 2 and the drain 3 with the metal lines 9a and 9b, respectively.

The silicide layers 6a and 6b are between the contact layers 7a and 7b and the upper surfaces of the source 2 and the drain 3, respectively, to decrease the surface resistance of the source 2 and the drain 3 relative and adjust the heights of the source 2 and the drain 3 to the height of the gate 1.

The FET 10 with the fin structure may have parasitic capacitance between each of the layers (i.e., silicide and contact) and the gate 1. When a signal generated in the source 2 and/or the drain 3 is transmitted to the metal lines 9a and 9b, the alternating current (AC) performance of the FET 10 may degraded due to the parasitic capacitance. As appreciated by the present inventors, the less the parasitic capacitance associated with the layers, the higher the performance of the FET 10 may be. The parasitic capacitance between each of the layers and the gate 1 is given by Equation 1:

$$C = \varepsilon \frac{A1}{D1}, \quad (1)$$

where C is the respective parasitic capacitance, A1 is an area of a layer facing the gate 1, D1 is a distance between the layer and the gate 1, and $\varepsilon$ is a dielectric constant. In other words, in order to reduce the parasitic capacitance C, the area A1 of the layer (e.g., a contact or silicide layer) facing the gate 1 may be reduced or the distance between the layers and the gate 1 may be increased. Alternatively, both the area and the distance may be adjusted. In some embodiments, the distance is an average distance from the face of the layer to the gate.

According to the embodiments of the inventive concept, the degradation due to parasitic capacitance is reduced by adjusting the aspect ratio of the silicide layers 6a and 6b at the respective two sides of the gate 1 in the FET 10, In some embodiments, the aspect ratio of the first silicide layer 6a at the side of the source 2 may be adjusted so that the first silicide layer 6a and the second silicide layer 6b at the side of the drain 3 are asymmetric in the FET 10. In some embodiments, the aspect ratio of the second silicide layer 6b at the side of the drain 3 may be adjusted so that the first silicide layer 6a at the side of the source 2 and the second silicide layer 6b are asymmetric in the FET 10. In some embodiments, the aspect ratio of both the first and second silicide layers 6a and 6b is adjusted so that the first and second silicide layers 6a and 6b are asymmetric.

Figure 3:
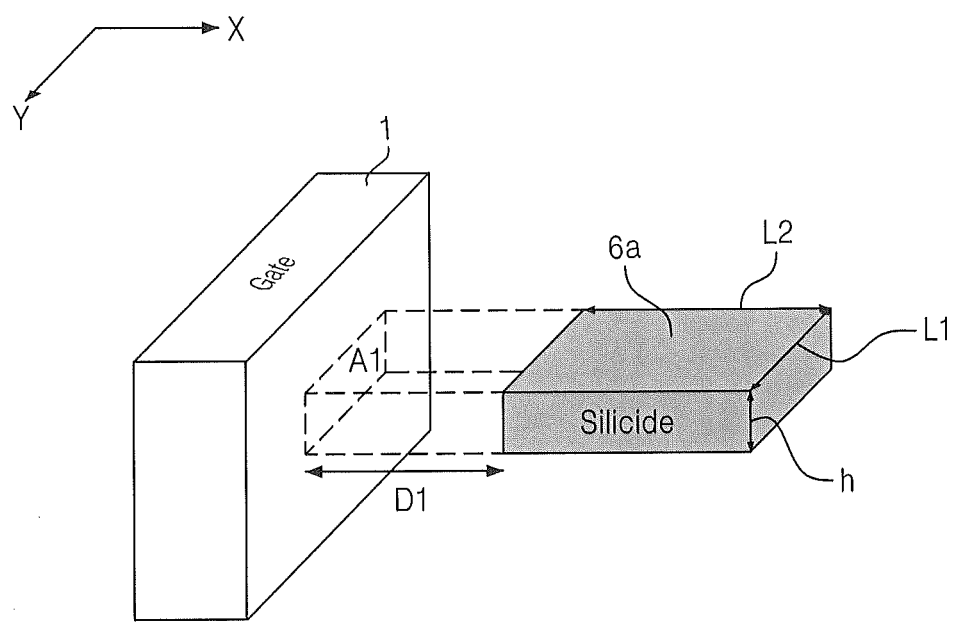
FIG. 3 is a perspective view of a silicide at a first end of the gate in the FET illustrated in FIG. 2.
Figure 4:
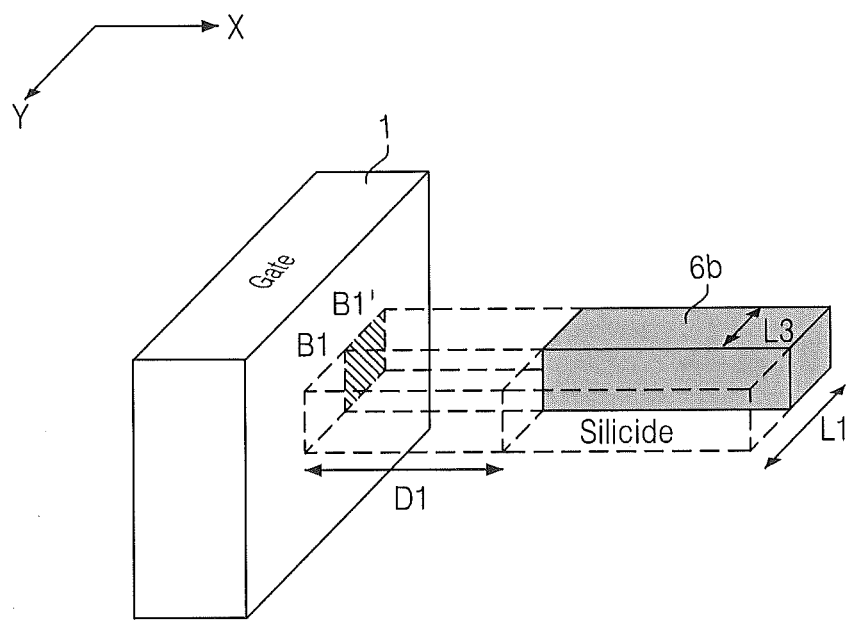
FIG. 4 is a perspective view of the silicide at a second end of the gate in the FET illustrated in FIG. 2.
Figure 5:
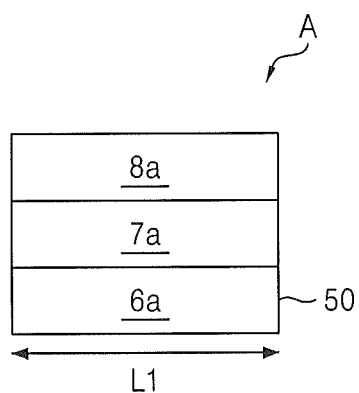
FIG. 5 is a cross-sectional view of silicide and contact layers viewed from the first end of the gate in the FET illustrated in FIG. 2.
Figure 6:
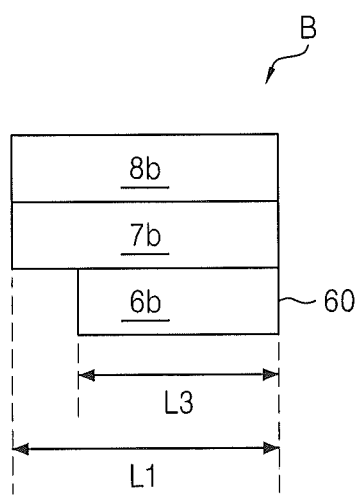
FIG. 6 is a cross-sectional view of silicide and contact layers viewed from the second end of the gate in the FET illustrated in FIG. 2.

FIG. 3 is a perspective view of the gate 1 and the silicide layer 6a at a first end of the gate 1 in the FET 10 illustrated in FIG. 2. FIG. 4 is a perspective view of the gate 1 and the silicide layer 6b at a second end of the gate 1 in the FET 10 illustrated in FIG. 2. FIG. 5 is a cross-sectional view of the silicide layer 6a and the contact layers 7a and 8a viewed from the first end of the gate 1 in the FET 10 illustrated in FIG. 2. FIG. 6 is a cross-sectional view of the silicide layer 6b and the contact layers 7b and 8b viewed from the second end of the gate 1 in the FET 10 illustrated in FIG. 2. It is assumed that the aspect ratio of the second silicide layer 6b at the side of the drain 3 is adjusted so that the first silicide layer 6a and the second silicide layer 6b are asymmetric in the FET 10.

Referring to FIGS. 3 and 5, the aspect ratio of the first silicide layer 6a is not adjusted and the surface of the first silicide layer 6a facing the gate has an area of A1 with respect to the gate 1 and is separated from the gate 1 by a distance of D1. However, referring to FIGS. 4 and 6, the aspect ratio of the surface 60 of the second silicide layer 6b is adjusted and the second silicide layer 6b has an area of B1 with respect to the gate 1 and is separated from the gate 1 by the distance D1. At this time, the A1 is larger than the area B1. When the lateral and longitudinal lengths of the surface 50 of the first silicide layer 6a are L1 and L2, respectively, the lateral length L1 of the area B1 of the surface 60 of the second silicide layer 6b is reduced to L3 so that the areas A1 and B1 are different from each other, i.e., asymmetric. The length L2 of the first and second silicide layers 6a and 6b may be not adjusted because may affect the height between the contact layers 7a and 8a or 7b and 8b and the source or drain 2 or 3.

The inventive concept is not restricted to the current embodiments. The aspect ratio of each of the surface of the silicide layers 6a and 6b facing both sides of the gate 1 may be adjusted in the FET 10, so that the degradation due to parasitic capacitance may be reduced. For instance, the first and second silicide layers 6a and 6b may be arranged asymmetrically around the gate 1 by adjusting the aspect ratio of the surface 50 of the first silicide layer 6a at the side of the source 2 in the FET 10. Alternatively, the first and second silicide layers 6a and 6b may be arranged asymmetrically around the gate 1 by adjusting both the aspect ratio of the surface 50 of the first silicide layer 6a at the side of the source 2 and the aspect ratio of the surface 60 of the second silicide layer 6b at the side of the drain 3 in the FET 10.

Figure 7:
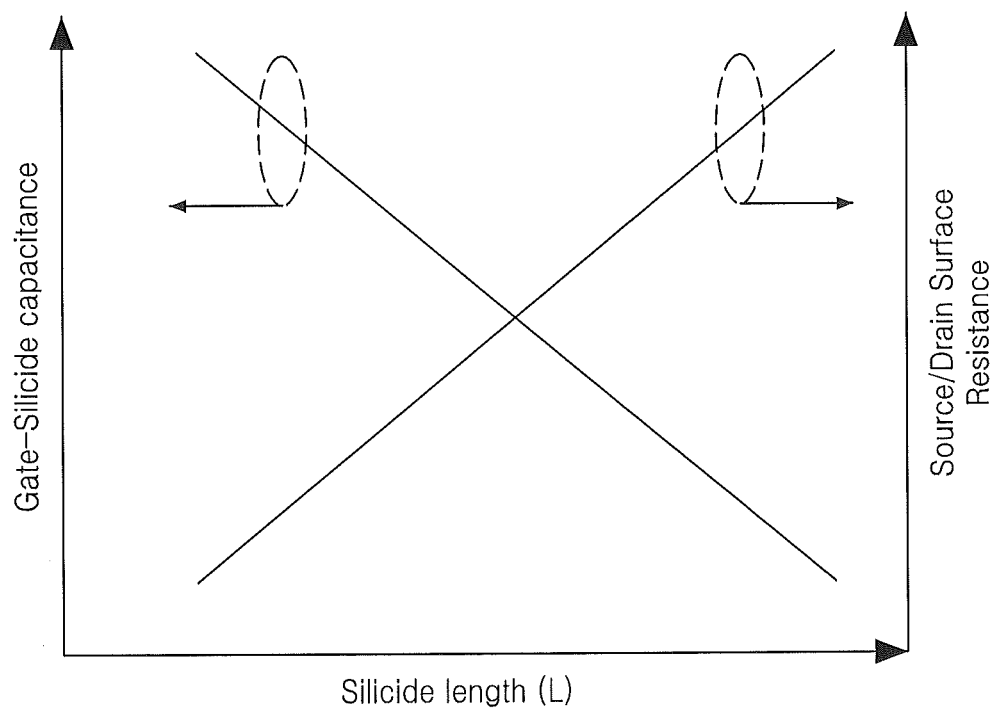
FIG. 7 is a graph showing gate-silicide capacitance and source/drain surface resistance with respect to the silicide length in a unit transistor according to some embodiments of the inventive concept.

FIG. 7 is a graph showing gate-silicide capacitance and source/drain surface resistance with respect to a silicide length L in a unit transistor according to some embodiments of the inventive concept. Referring to FIG. 7, when the lateral length of a silicide layer is reduced as shown in FIGS. 3 through 6 (L1>L3 at this time) in order to reduce a gate-silicide area (e.g., A1), the gate-silicide capacitance decreases linearly. Meanwhile, the source/drain surface resistance can be obtained using Equation 2:

$$R = \rho \frac{1}{S}, \quad (2)$$

where R is the surface resistance, $\rho$ is a resistance coefficient, "l" is the length, and S is the area.

According to Equation 2, the surface resistance R is inversely proportional to the area A1 of the silicide facing the gate 1 and is proportional to the distance D1 between the gate 1 and the silicide. Accordingly, when the area of the silicide is decreased from A1 to B1 by adjusting the lateral length of the silicide, the source/drain surface resistance increases.

In other words, when the silicide layers 6a and 6b at both sides of the gate 1 are adjusted to be asymmetric, the gate-silicide capacitance decreases, but the source/drain surface resistance R increases. If this happens in just a single FET 10, it may not be construed that the AC performance of the FET 10 increases. However, in a case of a bit cell array including a plurality of FETs 10, the AC performance increases. This will be described in detail with reference to FIGS. 8 through 14.

Figure 8:
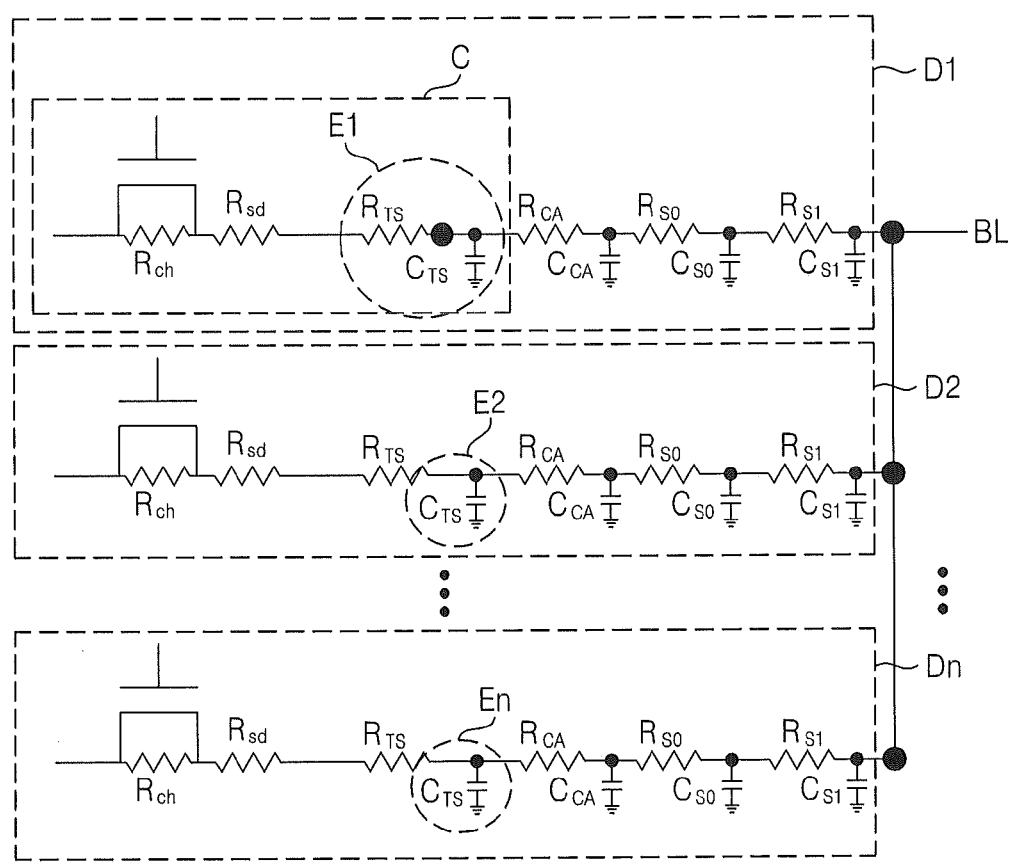
FIG. 8 is a circuit diagram of parasitic capacitance and resistance in a bit cell array including a unit transistor according to some embodiments of the inventive concept.
Figure 9:
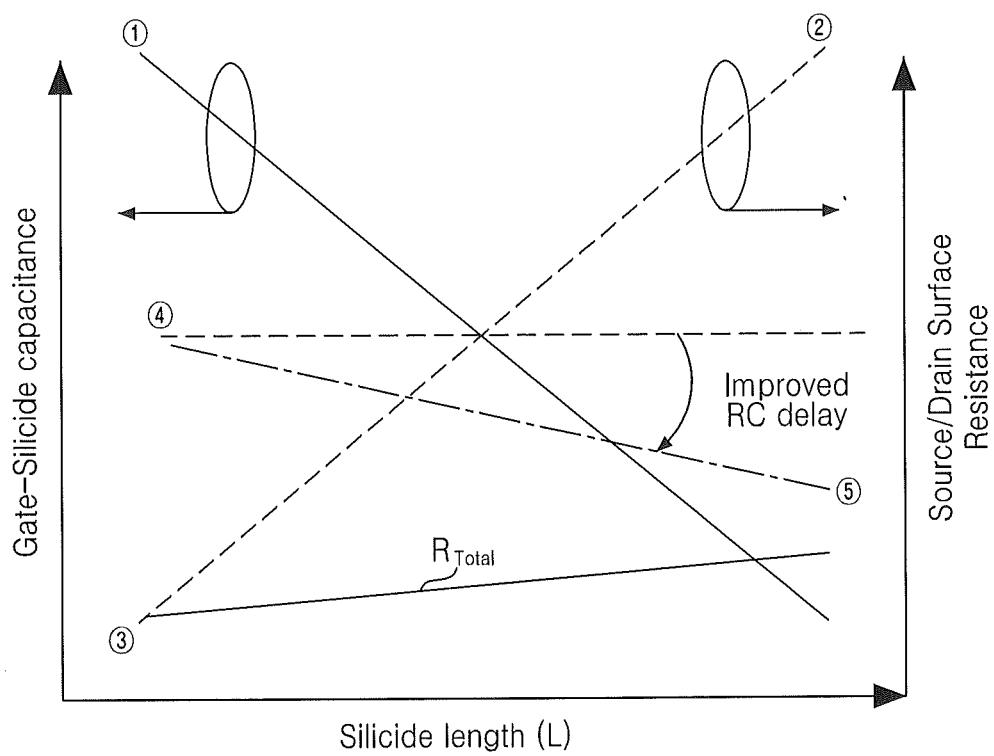
FIG. 9 is a graph showing gate-silicide capacitance, source/drain surface resistance, and resistance-capacitance (RC) delay with respect to the silicide length in the unit transistor of the bit cell array illustrated in FIG. 8.

FIG. 8 is a circuit diagram of parasitic capacitance and resistance in a bit cell array including a unit transistor, i.e., the FET 10 according to some embodiments of the inventive concept. FIG. 9 is a graph showing gate-silicide capacitance, source/drain surface resistance, and resistance-capacitance (RC) delay with respect to the silicide length L in the FET 10 of the bit cell array illustrated in FIG. 8. In FIG. 8, $R_{sd}$ denotes source-drain parasitic capacitance, $R_{ch}$ denotes parasitic resistance occurring in a channel of the FET 10, $R_{TS}$ denotes gate-silicide resistance, $C_{TS}$ denotes gate-silicide capacitance, $R_{CA}$ and $R_{SO}$ denote gate-contact resistance, $C_{CA}$ and $C_{SO}$ denote gate-contact capacitance, and $C_{S1}$ and $R_{S1}$ respectively denote gate-metal capacitance and gate-metal resistance.

When parasitic capacitance and parasitic resistance are modeled for the bit cell array, "n" FETs D1 through Dn are connected in parallel to a single bit line, as shown in FIG. 8. Even though there are multiple gate-silicide resistances $R_{TS}$, only one gate-silicide resistances $R_{TS}$ substantially has an effect as shown in a circle E1 due to the parallel connection since a word line activates one FET D1 to read a data bit. A total resistance $R_{Total}$ is the sum of resistances which have an effect when a single bit line is enabled and is defined as Equation 3:

$$R_{Total} = R_{ch} + R_{sd} + R_{TS} + R_{CA} + R_{S0} + R_{S1} + R_{D2}. \quad (3)$$

Here, since the gate-contact resistances $R_{CA}$ and $R_{S0}$ and the gate-metal resistance $R_{S1}$ are fixed, the total resistance $R_{Total}$ is substantially influenced by the gate-silicide resistance $R_{TS}$. A plurality of gate-silicide capacitances $C_{TS}$ are connected in parallel. A capacitance $C_{D1}$ per bit cell is defined based on a serial connection as Equation 4 and a capacitance $C_{Total}$ per bit line is defined based on a parallel connection as Equation 5:

$$\frac{1}{C_{D1}} = \frac{1}{C_{TS}} + \frac{1}{C_{CA}} + \frac{1}{C_{S0}} + \frac{1}{C_{S1}}, \quad (4)$$

and $$C_{Total} = C_{D1} + C_{D2} + \ldots + C_{Dn}. \quad (5)$$

With respect to the capacitance $C_{Total}$ per bit line, all gate-silicide capacitances $C_{TS}$ in circles E1 through En, which are connected in parallel to a single bit line, substantially have an effect. Since the gate-contact capacitances $C_{CA}$ and $C_{S0}$ and the gate-metal capacitance $C_{S1}$ are fixed, the total capacitance $C_{Total}$ is substantially influenced by the gate-silicide capacitance $C_{TS}$.

In a single FET 10, as shown in FIG. 7, as the length L of one silicide layer increase, the gate-silicide resistance $R_{TS}$ increases (②) and the gate-silicide capacitance $C_{TS}$ decreases. However, in the entire bit cell array where a plurality of FETs 10 are connected, even through a total resistance increases as the gate-silicide resistance $R_{TS}$ increases (②), the capacitance $C_{Total}$ per bit line decreases due to the decrease (①) in the gate-silicide capacitance $C_{TS}$. As a result, a time constant, i.e., the RC delay decreases (④⇒⑤) in the bit cell array. Accordingly, the entire performance of a memory device including the bit cell array including a plurality of FETs 10 increases.

Figure 10:
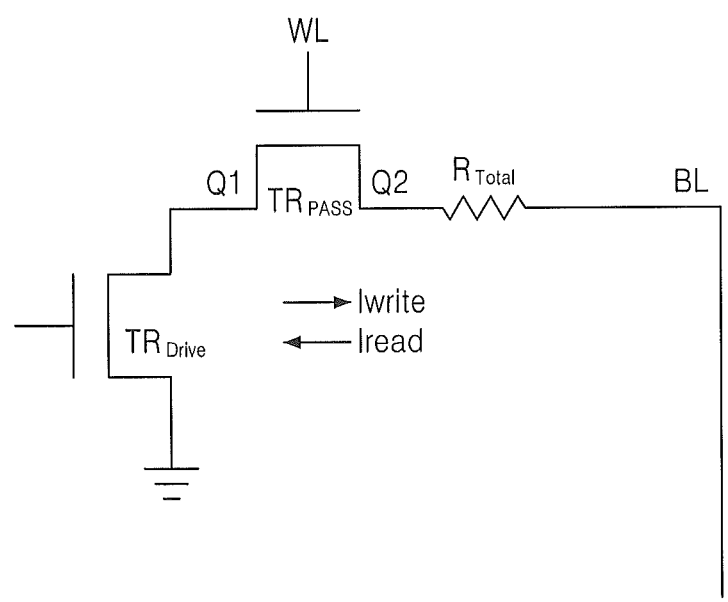
FIG. 10 is a circuit diagram of a unit transistor according to some embodiments of the inventive concept.
Figure 11:
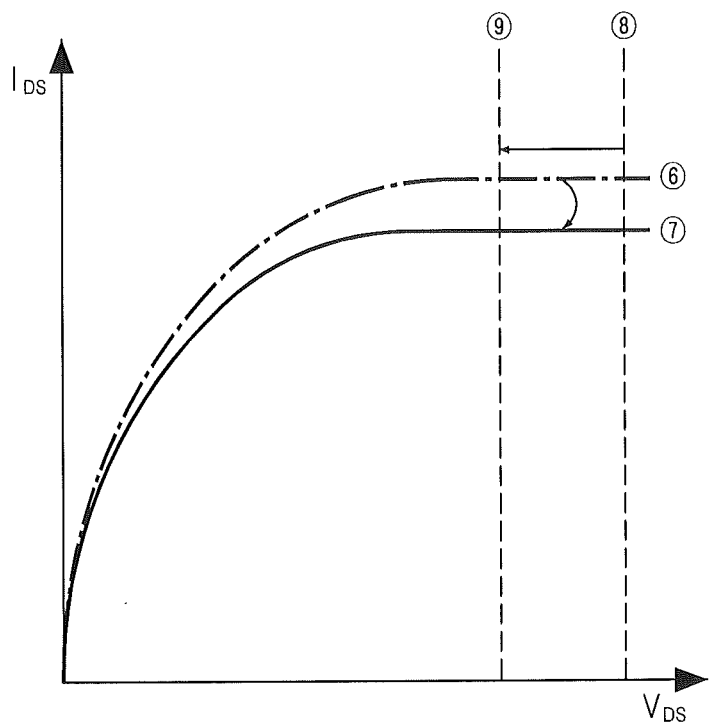
FIG. 11 is the voltage-current graph of a pass transistor illustrated in FIG. 10.

FIG. 10 is a circuit diagram of a unit transistor according to some embodiments of the inventive concept. FIG. 11 is the voltage-current graph of a pass transistor illustrated in FIG. 10.

Referring to FIG. 10, when a bit cell including the FET 10 is modeled, the bit cell includes a total resistance $R_{Total}$, a pass transistor $TR_{PASS}$, and a drive transistor $TR_{Drive}$. When a word line is enabled according to an operation on the bit cell, the pass transistor $TR_{PASS}$ and the drive transistor $TR_{Drive}$ are turned on. According to the operation, a source-drain direction is determined as shown in Table 1.

TABLE 1

| Operation | Source | Drain |
|---|---|---|
| Read | Q1 | Q2 |
| Write | Q2 | Q1 |

In a read operation, the pass transistor $TR_{PASS}$ has a node Q1 as a source and a node Q2 as a drain. During the read operation, a drain voltage drops due to the total resistance $R_{Total}$ and a drain-source voltage $V_{DS}$ decreases. A read current $I_{read}$ flows from the node Q2 to the node Q1. At this time, the pass transistor $TR_{PASS}$ is in a saturation area since a gate-source voltage hardly changes (⑥) even through the drain-source voltage $V_{DS}$ decreases (⑧⇒⑨), as shown in FIG. 11. As a result, the decrement in the read current $I_{DS}$ is very slight.

In a write operation, the current flows in an opposite direction to program data to the FET 10, so the node Q1 becomes a drain and the node Q2 becomes a source. In this case, a source voltage drops due to the total resistance $R_{Total}$ and the gate-source voltage $V_{GS}$ decreases (⑥⇒⑦). As a result, the decrement in the write current $I_{DS}$ may occur due to the total resistance $R_{Total}$, as shown in FIG. 11. However, since a strong external drive voltage is applied to the drive transistor $TR_{Drive}$ in the write operation of a memory device using the FET 10, the decrease in write current has a very limited affect on the overall write operation speed of the memory device.

Figure 12:
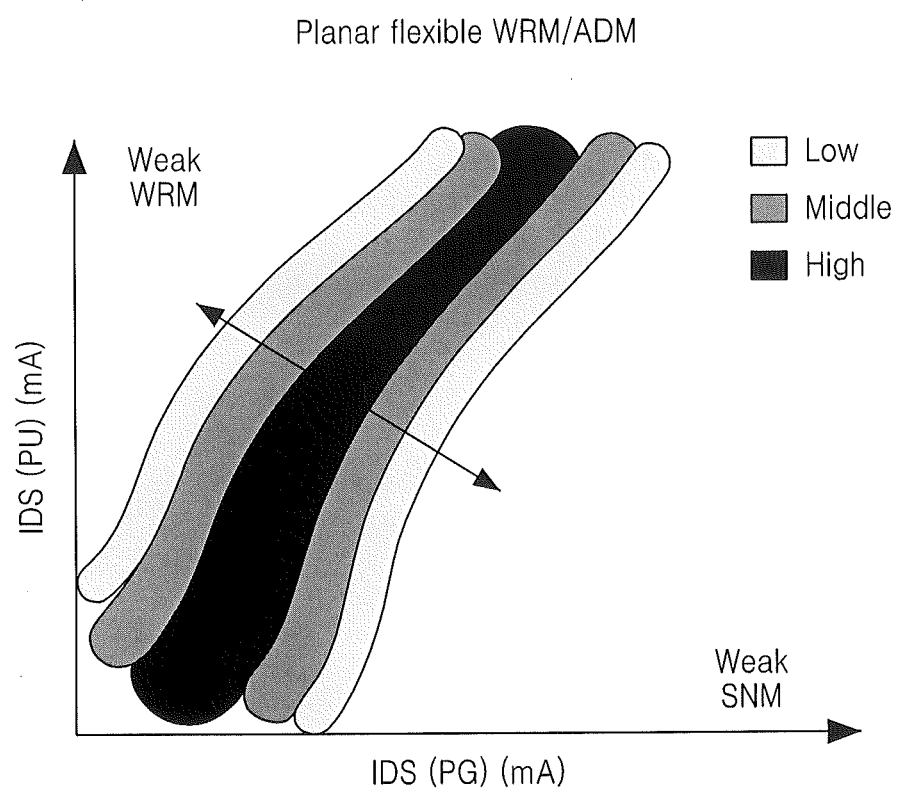
FIG. 12 is a graph of current versus current according to a pass transistor and a drive transistor in a static random access memory (SRAM) bit cell manufactured using a planar process in a comparison example.
Figure 13:
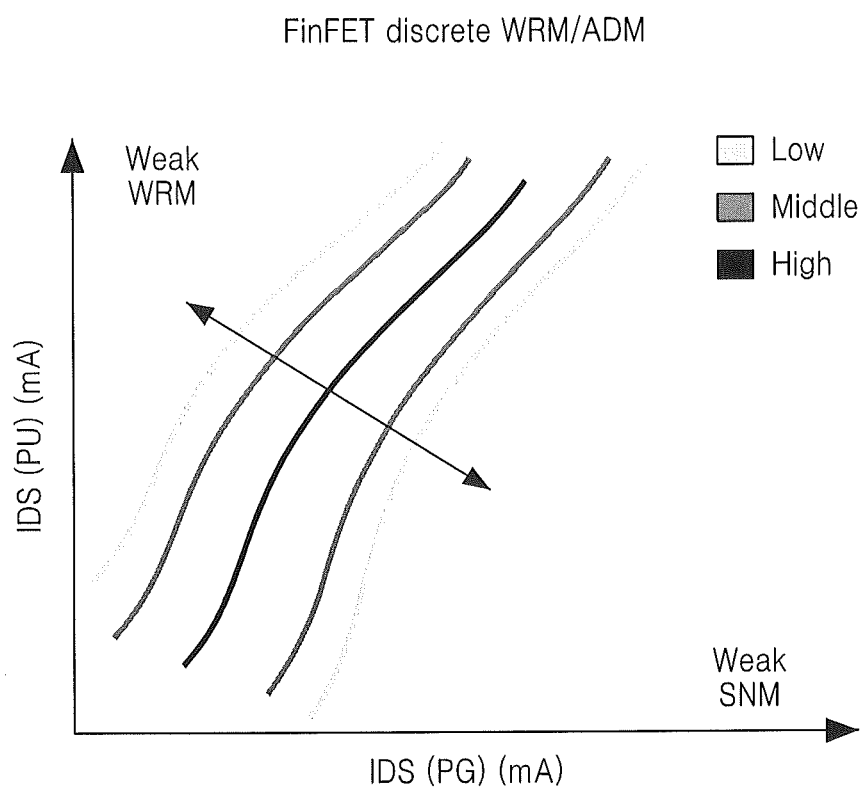
FIG. 13 is a graph of current versus current according to a pass transistor and a drive transistor in an SRAM bit cell including a FET in a comparison example.
Figure 14:
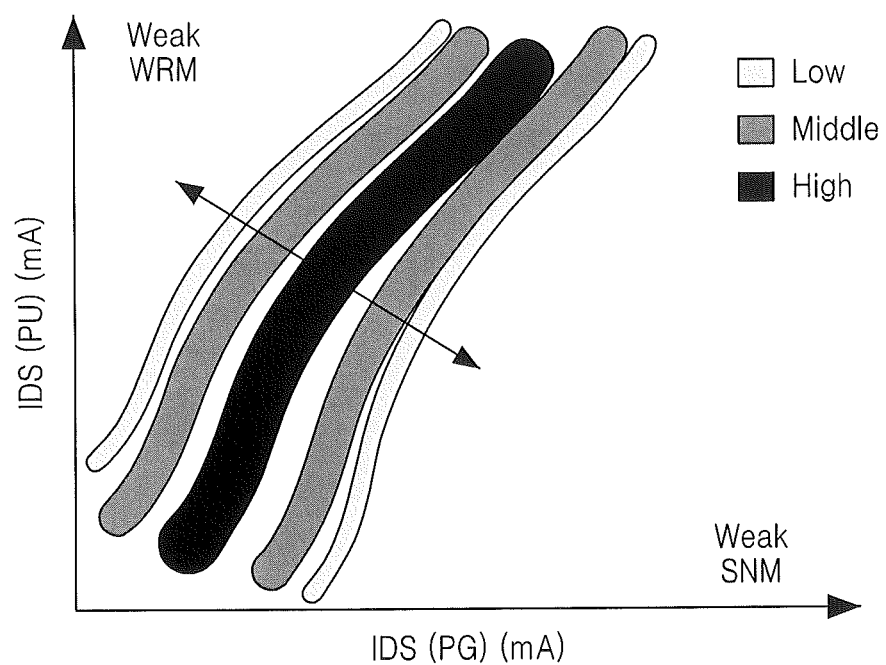
FIG. 14 is a graph of current versus current according to a pass transistor and a drive transistor in an SRAM bit cell including a FET according to some embodiments of the inventive concept.

FIG. 12 is a graph of current versus current according to a pass transistor and a drive transistor in a static random access memory (SRAM) bit cell manufactured using a planar process in a comparison example. FIG. 13 is a graph of current versus current according to a pass transistor and a drive transistor in an SRAM bit cell including an FET in a comparison example. FIG. 14 is a graph of current versus current according to a pass transistor and a drive transistor in an SRAM bit cell including an FET according to some embodiments of the inventive concept.

Referring to FIG. 12, according to the strength of the pass transistor and the drive transistor (or a pull-up transistor), a static noise margin (SNM) (or a read margin) and a writability margin (WRM) have dispositions toward opposite directions, respectively. In other words, a bit cell yield is highest when the strength of the pass transistor is similar to that of the drive transistor according to the threshold voltage of each transistor, the effective width of a fin, and the length of the fin. When the pass transistor is stronger than the drive transistor or when the drive transistor is stronger than the pass transistor, the bit cell yield decreases gradually to a middle and a low level and read stability (i.e., SNM) or write stability (i.e., WRM) is weakened. However, when SRAM bit cells are manufactured using the planar process, the bit cell yield has a linear distribution.

Referring to FIG. 13, since an area in which a fin FET can adjust the width of a transistor is discrete, the bit cell yield depending on the strength of each transistor has a discrete distribution. When the bit cell yield is discrete, bit cell stability (i.e., WRM and SNM) needs to be tuned in a very limited range in processes.

When a bit cell uses the FET 10 according to some embodiments of the inventive concept, resistance and capacitance are adjusted as described above, and therefore, the bit cell yield may have a semi-linear distribution, as shown in FIG. 14. As a result, bit cell stability (i.e., WRM and SNM) can be tuned in a wider range in processes.

Figure 15:
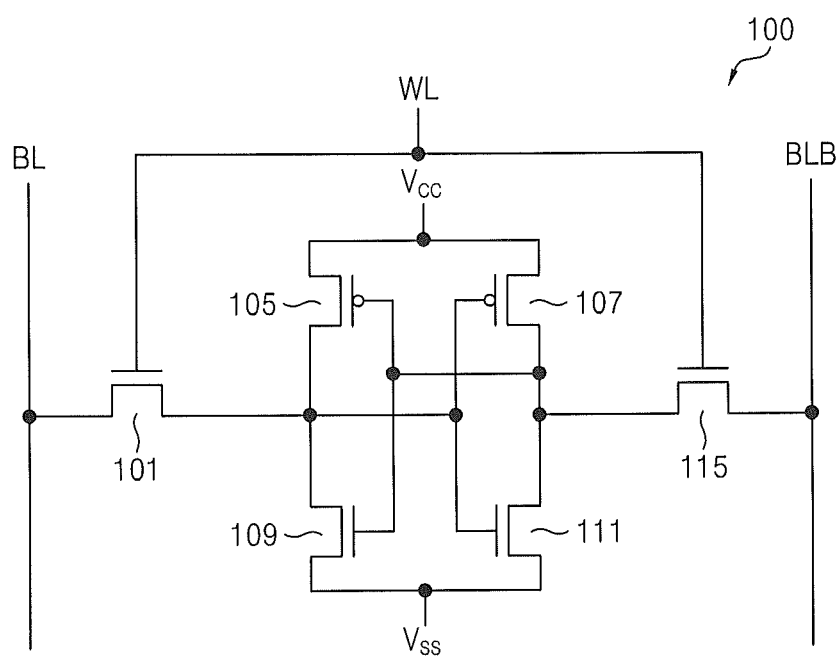
FIG. 15 is a circuit diagram of a 6-transistor (6T) memory cell.
Figure 16:
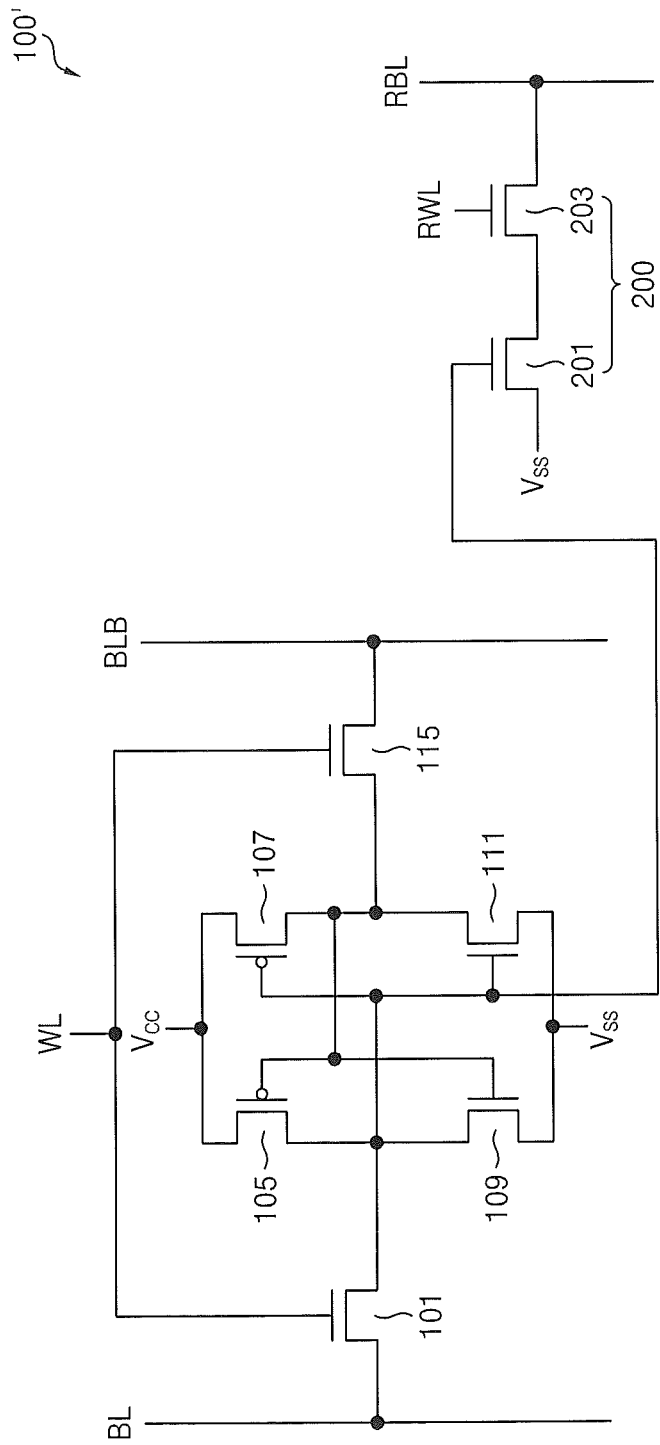
FIG. 16 is a circuit diagram of an 8-transistor (8T) memory cell.

FIG. 15 is a circuit diagram of a 6-transistor (6T) memory cell 100. FIG. 16 is a circuit diagram of an 8-transistor (8T) memory cell 100'.

Referring to FIG. 15, the memory cell 100 includes two cross-coupled inverters formed by electrically connecting a first pull-up transistor 105, a first pull-down transistor 109, a second pull-up transistor 107, and a second pull-down transistor 111 with one another. Drains of the first pull-down transistor 109 and the first pull-up transistor 105 are electrically connected with gates of the second pull-up transistor 107 and the second pull-down transistor 111. Drains of the second pull-up transistor 107 and the second pull-down transistor 111 are electrically connected with gates of the first pull-up transistor 105 and the first pull-down transistor 109.

The memory cell (e.g., SRAM cell) 100 also includes a first pass-gate transistor 101 and a second pass-gate transistor 115. Pass-gate transistors such as the first pass-gate transistor 101 and the second pass-gate transistor 115 may have a longer gate length than pull-down devices such as the first pull-down transistor 109 and the second pull-down transistor 111. Gates of the pass-gate transistors 101 and 115 are connected to a word line WL that controls an access to read data from or write data to the memory cell 100. Also, the first pass-gate transistor 101 is connected to a bit line BL and the second pass-gate transistor 115 is connected to a complementary bit line BLB. The first pass-gate transistor 101 is connected to a common node between the first pull-down transistor 109 and the first pull-up transistor 105. The second pass-gate transistor 115 is connected to a common node between the second pull-down transistor 111 and the second pull-up transistor 107.

In the embodiments illustrated in FIG. 15, data is written into the memory cell 100 by turning on the first pass-gate transistor 101 and the second pass-gate transistor 115 by applying a high voltage to the word line WL. When the pass-gate transistors 101 and 115 are turned on, both the bit line BL and the complementary bit line BLB may be used to write data to the memory cell 100.

Compared to the memory cell 100 illustrated in FIG. 15, the memory cell 100' illustrated in FIG. 16 further includes a read buffer 200. The memory cell 100' including 8 transistors provides individual read and write paths for a bit of data that has been stored. The read buffer 200 includes a read pass-gate transistor 203 and a read drive transistor 201. The read pass-gate transistor 203 and the read drive transistor 201 are connected in series between a read bit line RBL and a ground voltage. The read pass-gate transistor 203 is gated by a read word line RWL and individually reads a data cell according to the read bit line RBL. A gate of the read drive transistor 201 is connected to the gate of the second pull-up transistor 107 to generate a read current from the data cell.

Figure 17:
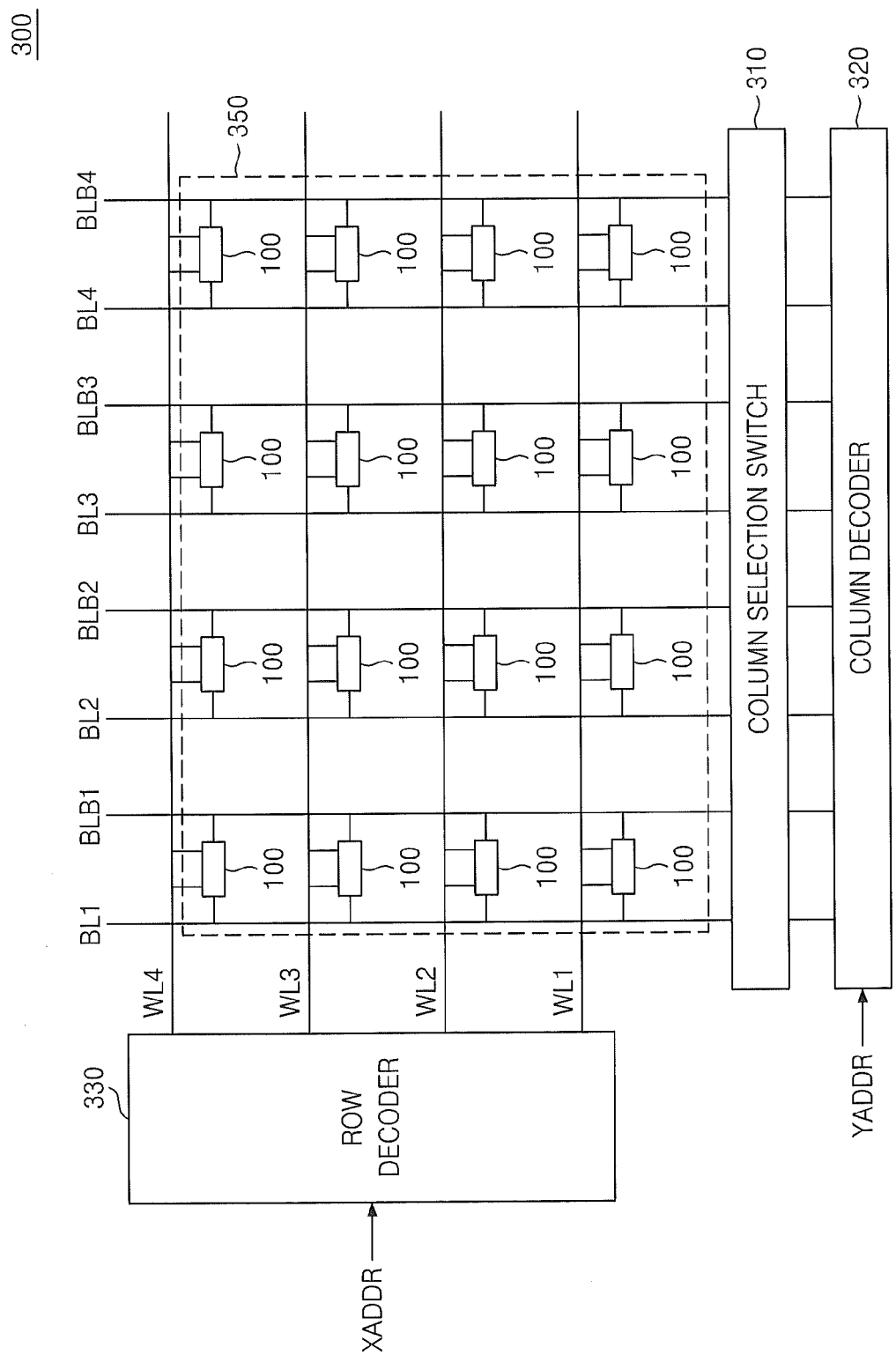
FIG. 17 is a block diagram of a memory device including a transistor according to some embodiments of the inventive concept.

FIG. 17 is a block diagram of a memory device 300 including a transistor according to some embodiments of the inventive concept. The memory device 300 includes a column selection switch 310, a column decoder 320, a row decoder 330, and a bit cell array 350.

The bit cell array 350 includes a plurality of bit cells 100. Each bit cell 100 may be implemented by an SRAM cell including the FET 10, as shown in FIG. 15 or 16.

The row decoder 330 decodes a row address XADDR and enables a word line WL corresponding to it. The column decoder 320 decodes a column address YADDR and enables bit lines BL and BLB corresponding to it. The column selection switch 310 switches the enabled bit lines BL and BLB. Although there are four word lines WL1 through WL4 and four bit lines BL1 through BL4 and BLB1 through BLB4 in FIG. 17, the inventive concept is not so restricted.

Figure 18:
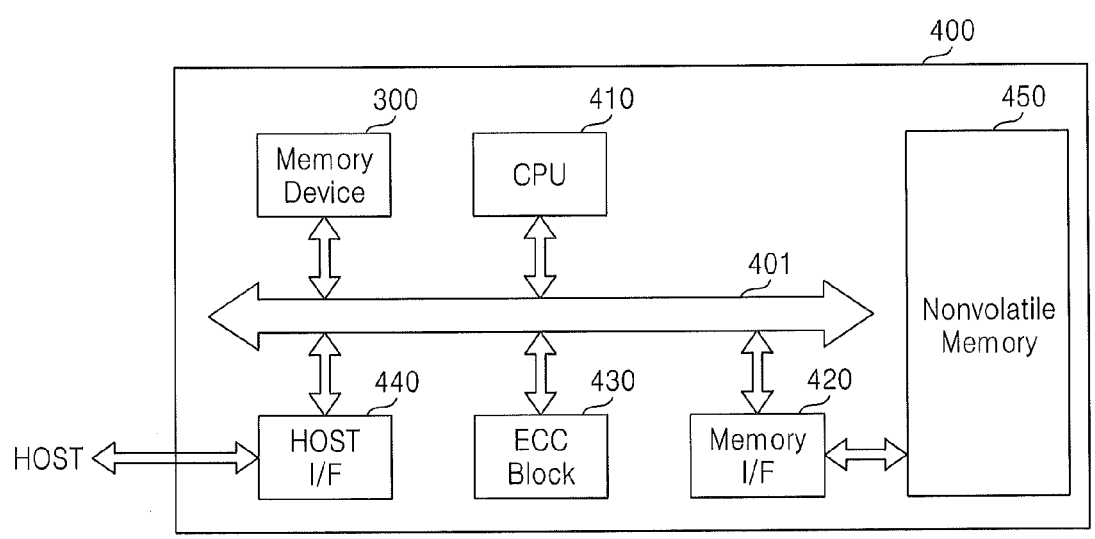
FIG. 18 is a block diagram of a memory system including the memory device illustrated in FIG. 17 according to some embodiments of the inventive concept.

FIG. 18 is a block diagram of a memory system 400 including the memory device 300 illustrated in FIG. 17 according to some embodiments of the inventive concept. The memory system 400 includes a non-volatile memory device 450, the memory device 300, and a central processing unit (CPU) 410 controlling the operations of the memory device 300 and the non-volatile memory device 450. The CPU 410 may be a microprocessor.

The memory device 300 may be used as an operating memory of the CPU 410. The memory device 300 may be implemented by SRAM. A host connected to the memory system 400 may perform data communication with the non-volatile memory device 450 through a memory interface (I/F) 420 and a host I/F 440.

According to the control of the CPU 410, an error correction code (ECC) block 430 may detect an error in data received from the non-volatile memory device 450 through the memory I/F 420, correct the bit in error, and transmit the corrected data to the host through the host IN 440. The CPU 410 may control data communication among the memory I/F 420, the ECC block 430, the host I/F 440, and the volatile memory device 300 via a bus 401.

The memory system 400 may be implemented as a flash memory drive, a universal serial bus (USB) flash memory drive, an inter-chip USB (IC-USB) memory drive, or a memory stick. Other implementations are also within the scope of the present inventive concept.

Figure 19:
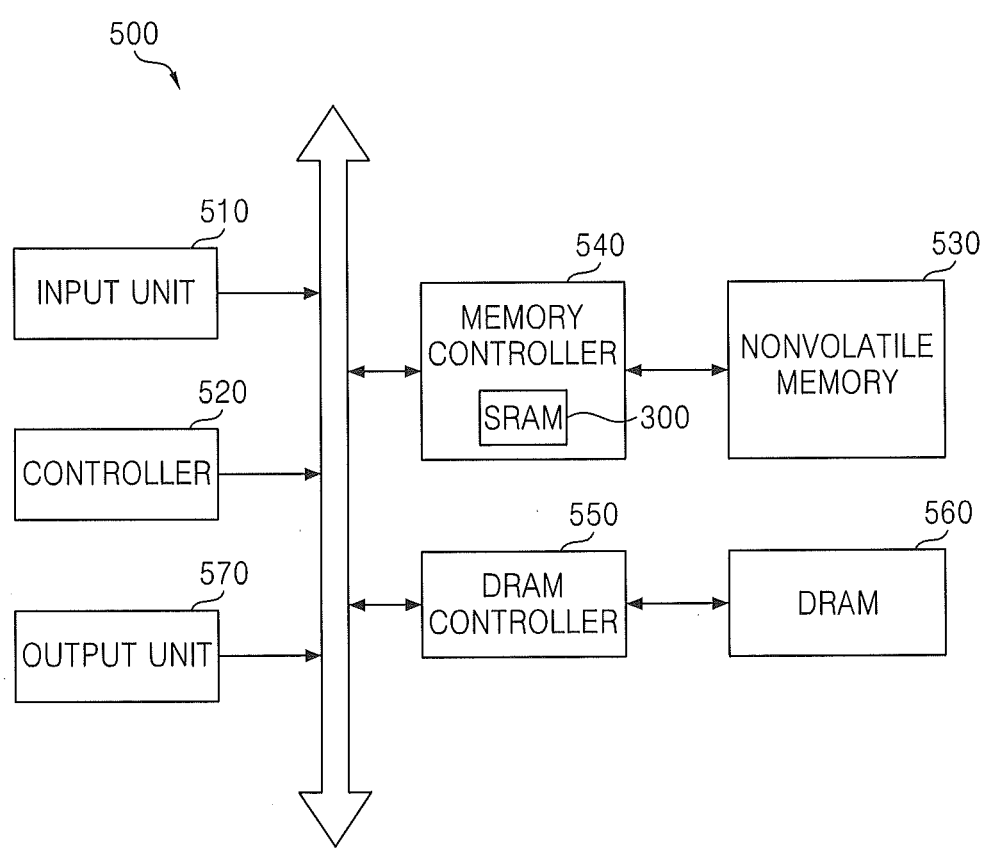
FIG. 19 is a block diagram of a memory system including the memory device illustrated in FIG. 17 according to some embodiments of the inventive concept.

FIG. 19 is a block diagram of a memory system 500 including the memory device 300 illustrated in FIG. 17 according to some embodiments of the inventive concept. The memory system 500 includes an input unit 510, a controller 520, a non-volatile memory device 530, a memory controller 540 including the SRAM 300, a dynamic RAM (DRAM) controller 550, a DRAM 560, and an output unit 570.

The input unit 510 can receive an external command. The controller 520 generates a control signal for executing the command received through the input unit 510.

According to the control signal, data stored in the non-volatile memory device 530 is transmitted to the memory controller 540 and stored in the SRAM 300 included in the memory controller 540. The memory controller 540 stores data from the non-volatile memory device 530 in the SRAM 300 functioning as a buffer memory before transmitting the data to the DRAM 560, thereby conducting delay that may occur when directly storing the data output from the non-volatile memory device 530 in the DRAM 560.

The DRAM controller 550 stores data output from the SRAM 300 in the DRAM 560. The data stored in the DRAM 560 may be output through the output unit 570 according to the control of the controller 520.

Figure 20:
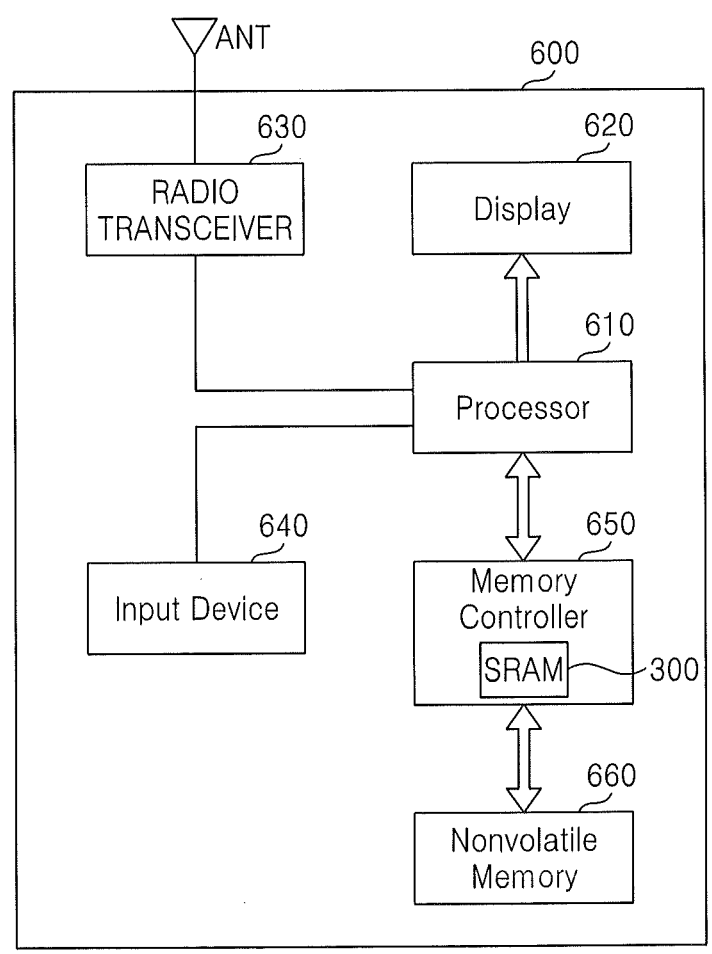
FIG. 20 is a block diagram of a mobile device including the memory device illustrated in FIG. 17 according to some embodiments of the inventive concept.

FIG. 20 is a block diagram of a mobile device 600 including the memory device 300 illustrated in FIG. 17 according to some embodiments of the inventive concept. Referring to FIGS. 17 and 20, the mobile device 600 may be implemented as a cellular phone, a smart phone, a tablet personal computer (PC), a personal digital assistant (PDA) or a radio communication system.

The mobile device 600 includes the non-volatile memory device 660 and a memory controller 650 controlling the operations of the non-volatile memory device 660. The memory controller 650 may control the data access operations, e.g., program operations, erase operations, and read operations, of the non-volatile memory device 660 according to the control of a processor 610.

The memory controller 650 includes the SRAM 300 for storing the data output from the non-volatile memory device 660. The SRAM 300 temporarily stores the data output from the non-volatile memory device 660. The data stored in the SRAM 300 may be transmitted to the processor 610.

A radio transceiver 630 transmits or receives radio signals through an antenna ANT. The radio transceiver 630 may convert radio signals received through the antenna ANT into signals that can be processed by the processor 610. Accordingly, the processor 610 may process the signals output from the radio transceiver 630 and transmit the processed signals to the memory controller 650 or the display 620. The memory controller 650 may program the signals processed by the processor 610 to the non-volatile memory device 660. The radio transceiver 630 may also convert signals output from the processor 610 into radio signals and transmit the radio signals to an external device via the antenna ANT.

An input device 640 enables control signals for controlling the operation of the processor 610 or data to be processed by the processor 610 to be input to the mobile device 600. The input device 640 may be implemented by a pointing device such as a touch pad or a computer mouse, a keypad, or a keyboard.

The processor 610 may control the operation of the display 620 to display data output from the memory controller 650, data output from the radio transceiver 630, or data output from the input device 640. The memory controller 650, which controls the operations of the non-volatile memory device 660, may be implemented as a part of the processor 610 or as a separate chip.

Figure 21:
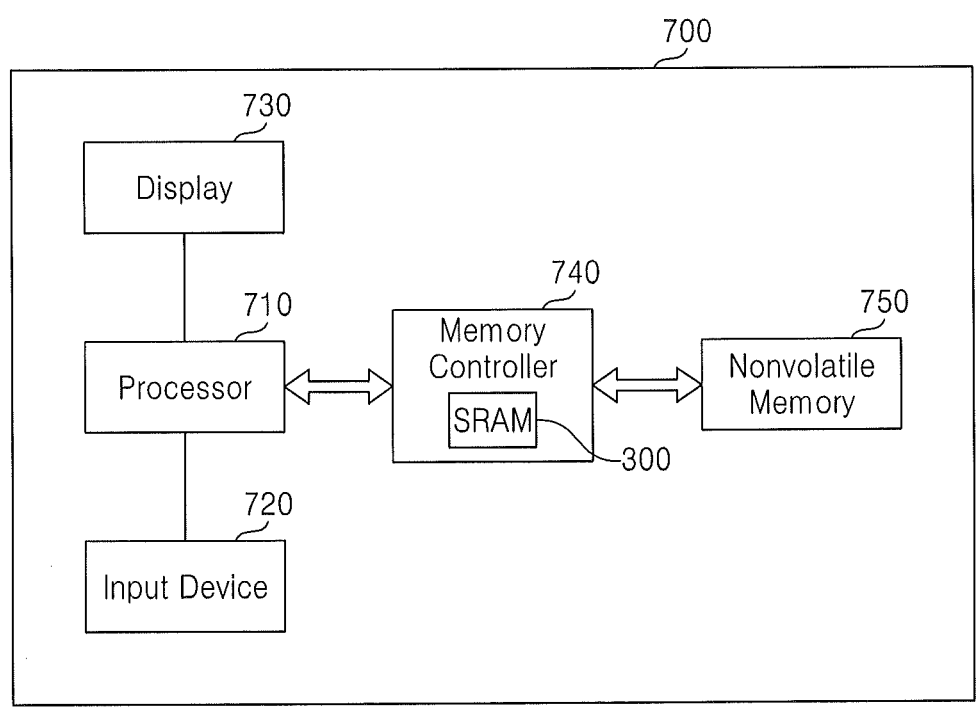
FIG. 21 is a block diagram of an electronic system including the memory device illustrated in FIG. 17 according to some embodiments of the inventive concept.

The memory controller 650 and the non-volatile memory device 660 may be implemented as single package, for example, a multi-chip package FIG. 21 is a block diagram of an electronic system 700 including the memory device 300 illustrated in FIG. 17 according to further embodiments of the inventive concept. The electronic system 700 may be implemented as a personal computer (PC), a tablet PC, a netbook, an e-reader, a personal digital assistant (PDA), a portable multimedia player (PMP), an MP3 player, an MP4 player or the like.

The electronic system 700 includes the non-volatile memory device 750 and a memory controller 740 controlling the data processing operations of the non-volatile memory device 750. The memory controller 740 includes the SRAM 300.

The memory controller 740 temporarily stores data output from the non-volatile memory device 750 in the SRAM 300. The data stored in the SRAM 300 may be transmitted to a processor 710.

The processor 710 may display data stored in the non-volatile memory device 750 through a display 730 according to data input through an input device 720. The input device 720 may be implemented by a pointing device such as a touch pad or a computer mouse, a keypad, or a keyboard.

The processor 710 may control the overall operation of the electronic system 700 and the operations of the memory controller 740. The memory controller 740, which may control the operations of the non-volatile memory device 750, may be implemented as a part of the processor 710 or as a separate chip.

Figure 22:
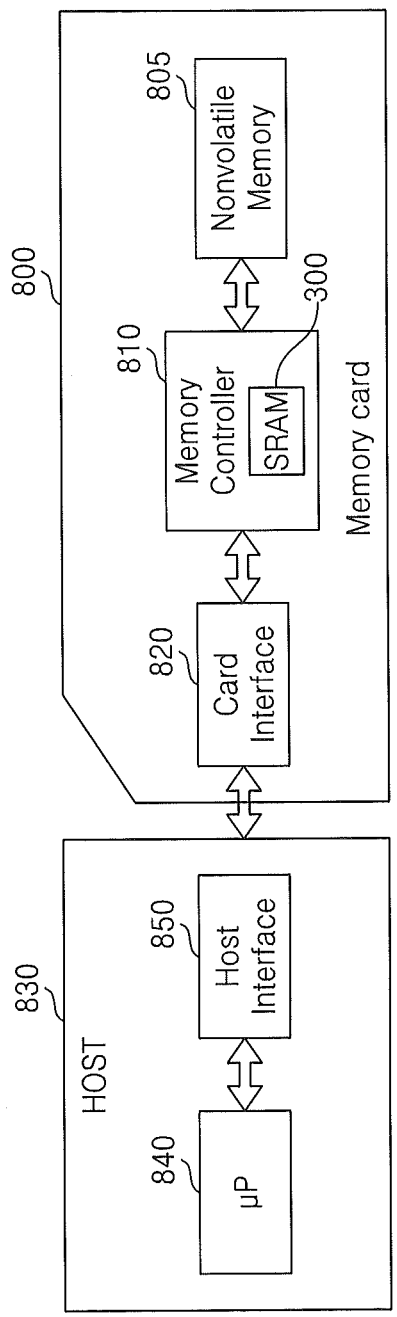
FIG. 22 is a block diagram of memory card including the memory device illustrated in FIG. 17 according to some embodiments of the inventive concept.

The memory controller 740 and the non-volatile memory device 750 may be implemented as single package, for example, a multi-chip package FIG. 22 is a block diagram of a memory card 800 including the memory device 300 illustrated in FIG. 17 according to some embodiments of the inventive concept. The memory card 800 may be implemented as any type of memory card, such as a smart card. The memory card 800 includes the non-volatile memory device 805, a memory controller 810, and a card interface 820.

The memory controller 810 may control data exchange between the non-volatile memory device 805 and the card interface 820. The card interface 820 may be a secure digital (SD) card interface or a multi-media card (MMC) interface, but the inventive concept is not so restricted.

The card interface 820 may interface to a host 830 and the memory controller 810 for data exchange according to a protocol of the host 830.

The memory controller 810 temporarily stores data output from the non-volatile memory device 805 in the SRAM 300. The data stored in the SRAM 300 may be transmitted to the card interface 820.

The card interface 820 may support a universal serial bus (USB) protocol, an interchip (IC)-USB protocol or other protocols. Here, the card interface 820 may indicate a hardware supporting a protocol used by the host 830, a software installed in the hardware, or a signal transmission mode.

When the memory card 800 is connected with the host 830 such as a PC, a tablet PC, a digital camera, a digital audio player, a cellular phone, a console video game hardware, or a digital set-top box, a host interface 850 of the host 830 may perform data communication with the non-volatile memory device 805 through the card interface 820 and the memory controller 810 according to the control of a microprocessor 840 (other processors may be used).

Figure 23:
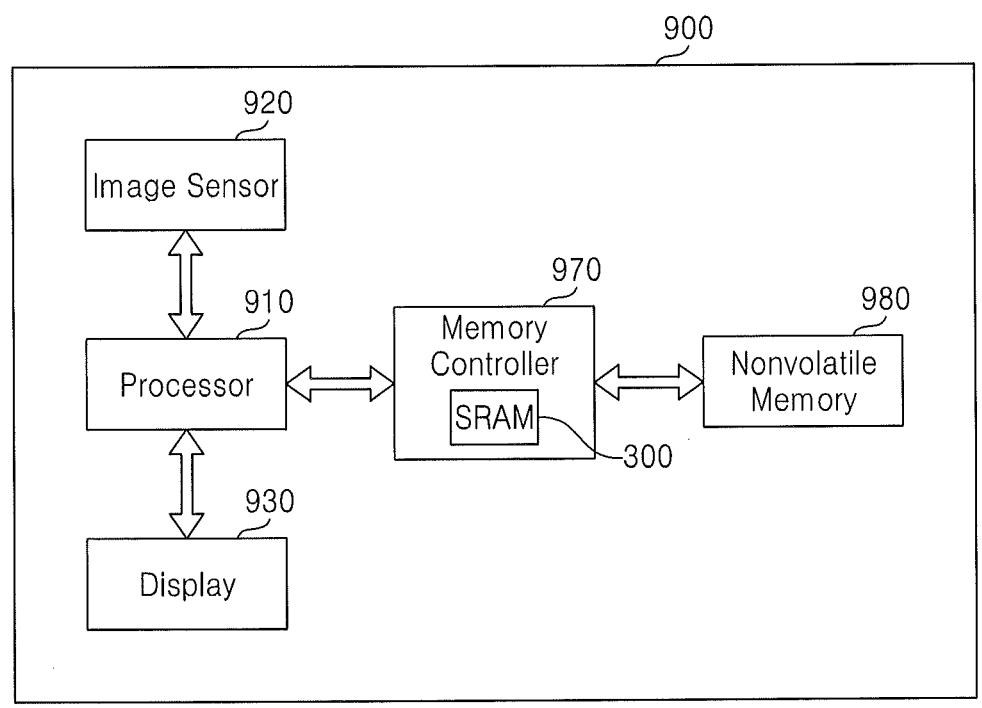
FIG. 23 is a block diagram of an imaging system including the memory device illustrated in FIG. 17 according to some embodiments of the inventive concept.

FIG. 23 is a block diagram of an imaging system 900 including the memory device 300 illustrated in FIG. 17 according to some embodiments of the inventive concept. The imaging system 900 may be implemented as an image processor included in a digital camera, a cellular phone equipped with a digital camera, a smart phone equipped with a digital camera, a tablet PC equipped with a digital camera or other electronic device.

The imaging system 900 includes the non-volatile memory device 980 and a memory controller 970 controlling the data processing operations, such as program operations, erase operations, and read operations, of the non-volatile memory device 980.

The memory controller 970 includes the SRAM 300 for temporarily storing data output from the non-volatile memory device 980 or data to be output to the non-volatile memory device 980.

An image sensor 920 included in the imaging system 900 converts optical images into digital signals and outputs the digital signals to a processor 910 or the memory controller 970. The digital signals may be controlled by the processor 910 to be displayed through a display 930 or stored in the non-volatile memory device 980 through the memory controller 970.

Data stored in the non-volatile memory device 980 may be displayed through the display 930 according to the control of the processor 910 or the memory controller 970. The memory controller 970, which may control the operations of the non-volatile memory device 980, may be implemented as a part of the processor 910 or as a separate chip.

Figure 24:
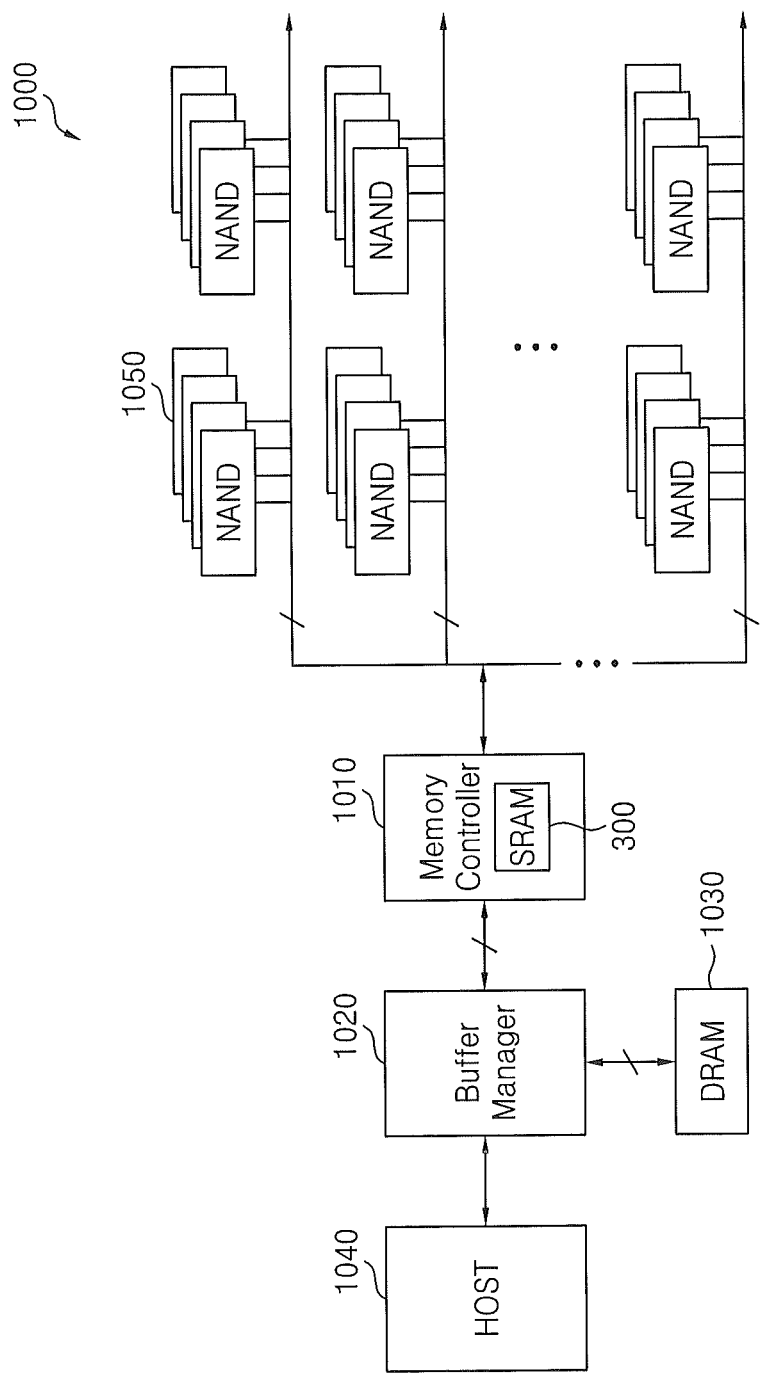
FIG. 24 is a block diagram of a memory system including the memory device illustrated in FIG. 17 according to some embodiments of the inventive concept.

FIG. 24 is a block diagram of a memory system 1000 including the memory device 300 illustrated in FIG. 17 according to some embodiments of the inventive concept. The memory system 1000 may be implemented as a data storage system like a solid state drive (SSD).

The memory system 1000 includes a plurality of non-volatile memory devices 1050 (such as NAND devices), a memory controller 1010 controlling the data processing operations of the non-volatile memory devices 1050, a dynamic random access memory (DRAM) 1030, and a buffer manager 1020 controlling data transferred between the memory controller 1010 and a host 1040 to be stored in the DRAM 1030.

The memory controller 1010 includes the SRAM 300. The SRAM 300 may temporarily store data output from the non-volatile memory device 1050 and transmit the data to the DRAM 1030 according to the control of the buffer manager 1020.

Figure 25:
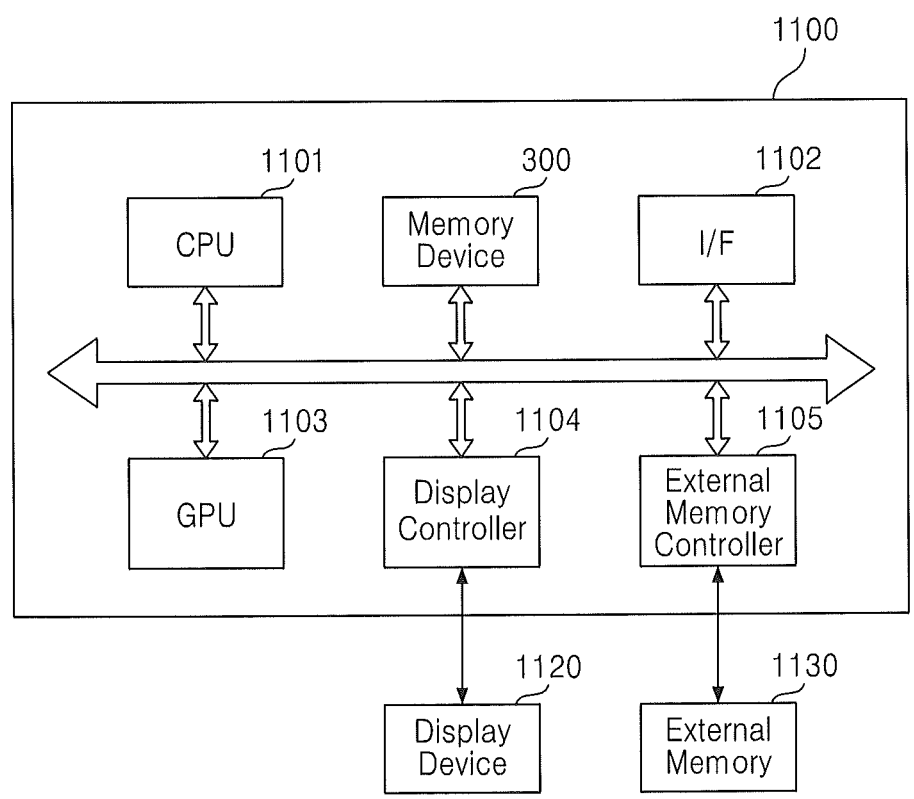
FIG. 25 is a block diagram of a system-on-chip (SoC) including the memory device illustrated in FIG. 17 according to some embodiments of the inventive concept.

FIG. 25 is a block diagram of a system-on-chip (SoC) 1100 including the memory device 300 illustrated in FIG. 17 according to some embodiments of the inventive concept. The SoC 1100 includes a CPU 1101, the memory device 300, an I/F 1102, a graphics processing unit (GPU) 1103, a display controller 1104, and an external memory controller 1105. The CPU 1101 which controls the overall operation of the SoC 1100 may control the operations of the elements 300, 1102, 1103, 1104, and 1105.

The external memory controller 1105 may control the operations when transmitting data to and receiving data from an external memory 1130 connected to the SoC 1100. GPU 1103 processes data that the memory controller 1105 has read from the external memory 1130 to provide signals suitable for display. The display controller 1104 controls whether to transmit the processed signal to a display device 1120.

As described above, according to some embodiments of the inventive concept, the aspect ratio of a silicide layer on a source/drain is adjusted to reduce a total capacitance in a FET, thereby increasing the read and write stability of a memory device.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed:

1. A field effect transistor (FET) comprising:
a first silicide layer on a source of the FET and the first silicide layer being separated from a gate of the FET;
a second silicide layer on a drain of the FET and the second silicide layer being separated from the gate; and
a first contact layer on the first silicide layer, wherein a lateral length of the first contact layer facing the gate is greater than a lateral length of the first silicide layer;
wherein an aspect ratio of at least one of the first and second silicide layers is adjusted so that the first and second silicide layers are asymmetric to one another.

2. The field effect transistor of claim 1, wherein the aspect ratio of at least one of the first and second silicide layers is adjusted so that an area of a surface of the first silicide layer facing the gate is smaller than an area of a surface of the second silicide layer facing the gate.

3. The field effect transistor of claim 1, wherein the aspect ratio of at least one of the first and second silicide layers is adjusted so that an area of a surface of the first silicide layer facing the gate is larger than an area of a surface of the second silicide layer facing the gate.

4. The field effect transistor of claim 2, wherein the lateral length of the first silicide layer is shorter than a lateral length of the second silicide layer and a longitudinal length of the first silicide layer is equal to a longitudinal length of the second silicide layer.

5. The field effect transistor of claim 3, wherein the lateral length of the first silicide layer is longer than a lateral length of the second silicide layer and a longitudinal length of the first silicide layer is equal to a longitudinal length of the second silicide layer.

6. A memory device comprising:
a memory cell array comprising a plurality of memory cells; and
a peripheral circuit configured to access the memory cells, wherein each of the memory cells comprises a plurality of field effect transistors(FETs), and
each of the field effect transistors comprises:
a first silicide layer on a source of the FET and the first silicide layer being separated from a gate of the FET;
a second silicide layer on a drain of the FET and the second silicide layer being separated from the gate, the second silicide layer having an area that faces the gate, wherein the area is asymmetric relative to an area of the first silicide layer that faces the gate; and
at least one contact positioned on each of the first and second silicide layers, wherein the at least one contact includes a contact layer that is on the first silicide layer, wherein a lateral length of the contact layer facing the gate is greater than a lateral length of the first silicide layer.

7. The memory device of claim 6, wherein an aspect ratio of at least one of the first and second silicide layers is adjusted so that the area of the first silicide layer facing the gate is larger than the area of the second silicide layer facing the gate.

8. The memory device of claim 7, wherein the lateral length of the first silicide layer is longer than a lateral length of the second silicide layer and a longitudinal length of the first silicide layer is equal to a longitudinal length of the second silicide layer.

9. The memory device of claim 6, wherein each of the memory cells comprises:
a first inverter comprising at least two of the field effect transistors;
a second inverter which comprises at least two of the field effect transistors and is cross-coupled with the first inverter; and
a pair of word line pass transistors connected with the first and second inverters, respectively, to read and write a data bit between the first inverter and the second inverter.

10. The memory device of claim 9, wherein each memory cell further comprises:
a read transistor configured to sink a read current from a precharged read bit line when a read word line is enabled; and
a read drive transistor configured to generate the read current between the first inverter and the second inverter,
the first inverter, the second inverter, and the pair of word line pass transistors are connected between a pair of write bit lines, and
the pair of word line pass transistors are connected to a write word line.

11. The memory device of claim 9, wherein each of the first and second inverters comprises:
one of the field effect transistors, which is a P type; and
one of the field effect transistors, which is an N type, is connected in series with the P-type field effect transistor, and shares an input signal with a gate of the P-type field effect transistor.

12. The memory device of claim 6, wherein the memory device comprises a static random access memory (SRAM) device.

13. A fin Field Effect Transistor (finFET) comprising:
a source region and a drain region of the finFET;
a gate of the finFET crossing over a fin of the finFET between the source and drain regions; and
first and second silicide layers on the source and drain regions respectively, the first and second silicide layers including respective first and second surfaces that face the gate crossing over the fin, wherein the first and second surfaces are different sizes.

14. The finFET of claim 13 wherein the surfaces comprise different respective aspect ratios.

15. The finFET of claim 13 wherein the surfaces each define respective first and second areas that are each defined by a first dimension in a first direction in which the gate crosses over the fin and a second dimension in a second direction that is orthogonal to the first direction.

16. The finFET of claim 15 wherein the second dimensions of the first and second surfaces are equal to one another.

17. The finFET of claim 15 wherein the first dimensions of the first and second surfaces are different from one another.

18. The finFET of claim 13 further comprising:
first and second contact layers on the first and second silicide layers, respectively.

19. The finFET of claim 18 wherein a first or second silicide layer defines a footprint contacted by the first or second contact layer, the footprint being smaller than a footprint for the first or second contact layer.

20. The finFET of claim 18 wherein a first or second silicide layer defines a footprint contacted by the first or second contact layer, the footprint being equal to a footprint for the first or second contact layer.

21. The finFET of claim 13 wherein the finFET comprises a first finFET in an SRAM cell, the SRAM cell further comprising a second finFET including:
a source region and a drain region of the second finFET;
a gate of the second finFET crossing over a fin of the second finFET between the source and drain regions; and
first and second silicide layers on the source and drain regions respectively, the first and second silicide layers including respective first and second surfaces that face the gate crossing over the fin, wherein the first and second surfaces are equal sizes, wherein the first and second finFETs respectively comprise a drive finFET for the SRAM cell and a pass finFET for the SRAM cell.

22. The finFET of claim 13 wherein the finFET comprises a first finFET in an SRAM cell, the SRAM cell further comprising a second finFET including:
a source region and a drain region of the second finFET;
a gate of the second finFET crossing over a fin of the second finFET between the source and drain regions; and
first and second silicide layers on the source and drain regions respectively, the first and second silicide layers including respective first and second surfaces that face the gate crossing over the fin, wherein the first and second surfaces are equal sizes, wherein the first and second finFETs respectively comprise a pass finFET for the SRAM cell and a drive finFET for the SRAM cell.

23. A memory cell array comprising at least one of the finFET of claim 13.

* * * * *